(12) United States Patent
Agarwal et al.

(10) Patent No.: US 6,770,911 B2
(45) Date of Patent: Aug. 3, 2004

(54) LARGE AREA SILICON CARBIDE DEVICES

(75) Inventors: Anant Agarwal, Chapel Hill, NC (US); Sei-Hyung Ryu, Cary, NC (US); John W. Palmour, Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 09/952,064

(22) Filed: Sep. 12, 2001

(65) Prior Publication Data

US 2003/0047748 A1 Mar. 13, 2003

(51) Int. Cl.[7] .................... H01L 29/417; H01L 31/312
(52) U.S. Cl. ................ 257/77; 257/107; 257/113; 257/114
(58) Field of Search .................. 257/77, 107, 113–118

(56) References Cited

U.S. PATENT DOCUMENTS

| | | | |
|---|---|---|---|
| 4,387,503 A | 6/1983 | Aswell et al. | 29/575 |
| 4,543,594 A | 9/1985 | Mohsen et al. | 357/51 |
| 4,605,872 A | 8/1986 | Rung | 341/118 |
| 4,777,471 A | 10/1988 | Comer | 341/118 |
| 4,779,126 A | 10/1988 | Herman | 357/38 |
| 4,799,126 A | 1/1989 | Kruse et al. | 361/101 |
| 4,860,185 A | 8/1989 | Brewer et al. | 363/41 |
| 4,866,500 A * | 9/1989 | Nishizawa et al. | 357/38 |
| 4,885,477 A | 12/1989 | Bird et al. | 307/296.8 |
| 4,894,791 A | 1/1990 | Jiang et al. | 364/570 |
| 4,910,508 A | 3/1990 | Yamazaki | 340/825 |
| 5,021,861 A | 6/1991 | Baliga | 357/51 |

(List continued on next page.)

FOREIGN PATENT DOCUMENTS

| | | | | |
|---|---|---|---|---|
| DE | 3632489 A1 * | 4/1987 | | H01L/29/06 |
| EP | 0108961 | 5/1984 | | |
| EP | 0336528 | 10/1989 | | |
| EP | 0 336528 A2 * | 11/1989 | | H01L/23/052 |
| EP | 0341001 | 11/1989 | | |
| JP | 358118418 | * 1/1982 | | H01L/29/747 |
| JP | 5811848 | 10/1983 | | |
| WO | Wo 95/32524 | 11/1995 | | |

OTHER PUBLICATIONS

B. Jayant Baliga, "Modern Power Devices", Krieger Publishing Co., Malabar, Florida (USA), Reprint Edition 1992 (ISBN: 0–89464–799–7), pp. 346–350 (Section 7/1, "MOS Gated Thyristor").*
Sze, S.M., "Physics of Semiconductor Devices", Second Edition, John Wiley & Sons, 1981, p. 72 and figure 8.*
Copy of International Search Report for PCT/US02/30300, dated Feb. 10, 2003.
M. Stoisiek, et al. *A Large Area MOS–GTO With Wafer Repair Technique.* Siemens AG, Corporate Research Laboratories, 1987, pp. 666–669.
J. Tihanyi, et al. *Functional Integration of Power MOS and Bipolar Devices.* IEEE, 1980, pp. 75–78.
B. Jayant Baliga, "Power Metal–Oxide–Semiconductor Field–Effect Transistors." *Modern Power Devices.*

*Primary Examiner*—Nathan J. Flynn
*Assistant Examiner*—Johannes Mondt
(74) *Attorney, Agent, or Firm*—Myers Bigel Sibley & Sajovec, P.A.

(57) ABSTRACT

Large area silicon carbide devices, such as light-activated silicon carbide thyristors, having only two terminals are provided. The silicon carbide devices are selectively connected in parallel by a connecting plate. Silicon carbide thyristors are also provided having a portion of the gate region of the silicon carbide thyristors exposed so as to allow light of an energy greater than about 3.25 eV to activate the gate of the thyristor. The silicon carbide thyristors may be symmetric or asymmetrical. A plurality of the silicon carbide thyristors may be formed on a wafer, a portion of a wafer or multiple wafers. Bad cells may be determined and the good cells selectively connected by a connecting plate.

19 Claims, 4 Drawing Sheets

U.S. PATENT DOCUMENTS

| | | | | |
|---|---|---|---|---|
| 5,539,217 A | * | 7/1996 | Edmond et al. | 257/77 |
| 5,606,196 A | * | 2/1997 | Lee et al. | 257/503 |
| 5,663,580 A | * | 9/1997 | Harris et al. | 257/77 |
| 5,804,841 A | * | 9/1998 | Satoh et al. | 257/117 |
| 5,831,289 A | * | 11/1998 | Agarwal | 257/77 |
| 5,883,403 A | | 3/1999 | Ishikawa et al. | 257/156 |
| 6,002,143 A | * | 12/1999 | Terasawa | 257/77 |
| 6,054,728 A | * | 4/2000 | Harada et al. | 257/133 |
| 6,066,864 A | * | 5/2000 | Ruff et al. | 257/175 |
| 6,154,477 A | * | 11/2000 | Weidenheimer et al. | 372/50 |
| 6,281,521 B1 | * | 8/2001 | Singh | 257/77 |
| 6,300,248 B1 | * | 10/2001 | Lin et al. | 438/692 |
| 6,380,569 B1 | * | 4/2002 | Chang et al. | 257/256 |

* cited by examiner

LARGE AREA SILICON CARBIDE DEVICES

The present invention was made, with Government support under contract number 530-1360-03 awarded by the United States Office of Naval Research. The Government has certain rights in this invention.

FIELD OF THE INVENTION

This invention relates to microelectronic devices and fabrication methods therefor, and more particularly to two electrical terminal silicon carbide devices, such as light activated silicon carbide thyristors, and manufacturing methods therefor.

BACKGROUND OF THE INVENTION

Silicon carbide thyristors are described, for example, in U.S. Pat. No. 5,539,217 (the '217 patent) the disclosure of which is incorporated herein by reference as if set forth fully. The thyristors described in the '217 patent are three terminal devices having a gate and one of an anode or a cathode on a first side of the device and the other of the anode and the cathode on the opposite side of the device. Such silicon carbide thyristors may exhibit improved power handling capabilities over similar silicon thyristors.

Light-activated thyristors having an integrated light source and a silicon carbide active layer have been described in U.S. Pat. No. 5,663,580. Such devices may include four terminal devices and include anode and cathode terminals for a light emitting diode which acts to trigger a thyristor having its own anode and cathode terminals.

Silicon thyristors which are light activated have been utilized in high power applications. For example, optically triggered parallel lateral thyristors are described in U.S. Pat. No. 4,779,126.

While silicon carbide thyristors may provide improved power handling capabilities over comparably sized silicon devices, it may be difficult to create large scale thyristors in silicon carbide. For example, in silicon a single thyristor may be made on a wafer such that the thyristor is substantially the same size as the wafer. However, manufacturing defect free silicon carbide wafers may be difficult, if not impossible. Thus, a device which consumes an entire wafer may have defects incorporated into the device which may limit its performance.

SUMMARY OF THE INVENTION

Embodiments of the present invention provide light-activated silicon carbide thyristors and methods of fabricating light-activated silicon carbide thyristors. In particular embodiments of the present invention, a first layer of silicon carbide having a second conductivity type is provided on a silicon carbide substrate having a first conductivity type. A first region of silicon carbide having the first conductivity type is provided on the first layer of silicon carbide opposite the substrate. A second region of silicon carbide having the second conductivity type is provided on the first region of silicon carbide opposite the first layer of silicon carbide and is configured to expose a portion of the first region of silicon carbide to light from a light source external to the silicon carbide thyristor so as to provide a light-activated gate region. A first electrode is provided on the second region of silicon carbide and a second electrode is provided on the silicon carbide substrate.

In further embodiments of the present invention, a second layer of silicon carbide is disposed between the silicon carbide substrate and the first layer of silicon carbide. The second layer of silicon carbide has the first conductivity type.

In additional embodiments of the present invention, a second layer of silicon carbide is disposed between the silicon carbide substrate and the first layer of silicon carbide. The second layer of silicon carbide is of the second conductivity type and has a carrier concentration greater than a carrier concentration of the first layer of silicon carbide.

In particular embodiments of the present invention, the first region of silicon carbide forms a mesa. In such embodiments, a third region of first conductivity type silicon carbide may be provided in the first layer of silicon carbide outside of the mesa formed by the first region of silicon carbide so as to provide a junction termination extension.

In still further embodiments of the present invention, a third region of silicon carbide having the first conductivity type is provided in the exposed portion of the first region of silicon carbide. Such a third region of silicon carbide may have a carrier concentration greater than a carrier concentration of the first region of silicon carbide.

Furthermore, the second region of silicon carbide may be configured to expose a pinwheel-shaped portion of the first region of silicon carbide to light from a light source external to the silicon carbide thyristor so as to provide a light-activated gate region having a pinwheel configuration. Alternatively, the second region of silicon carbide may be a plurality of fingers configured to expose a corresponding plurality of finger portions of the first region of silicon carbide to light from a light source external to the silicon carbide thyristor so as to provide a light-activated gate region interdigited with the second region of silicon carbide.

In further embodiments of the present invention, a silicon carbide thyristor, is provided having a silicon carbide substrate having a first conductivity type and a first layer of silicon carbide on the silicon carbide substrate and having a second conductivity type. A first region of silicon carbide having the first conductivity type is provided on the first layer of silicon carbide opposite the substrate. A second region of silicon carbide having the second conductivity type is also provided on the first region opposite the first layer. The first and second regions of silicon carbide are configured to expose a portion of the first layer of silicon carbide to light from a light source external to the silicon carbide thyristor so as to provide a light-activated gate region. A first electrode is provided on the second region of silicon carbide and a second electrode is also provided on the silicon carbide substrate.

In additional embodiments of the present invention, a second layer of silicon carbide is disposed between the silicon carbide substrate and the first layer of silicon carbide and having the first conductivity type. Furthermore, a third region of silicon carbide having the second conductivity type may be provided in the exposed portion of the first layer of silicon carbide and may have a carrier concentration greater than a carrier concentration of the first layer of silicon carbide.

In still further embodiments of the present invention, the first and second regions of silicon carbide are configured to expose a pinwheel-shaped portion of the first layer of silicon carbide to light from a light source external to the silicon carbide thyristor so as to provide a light-activated gate region having a pinwheel configuration. Alternatively, the first and second regions of silicon carbide may be a plurality of fingers configured to expose a corresponding plurality of finger portions of the first layer of silicon carbide to light from a light source external to the silicon carbide thyristor so as to provide a light-activated gate region interdigited with the first and second regions of silicon carbide.

In certain embodiments of the present invention, in the first conductivity type is n-type conductivity silicon carbide and the second conductivity type is p-type conductivity silicon carbide. In other embodiments of the present invention, the first conductivity type is p-type conductivity silicon carbide and the second conductivity type is n-type conductivity silicon carbide.

In additional embodiments of the present invention, a light-activated silicon carbide thyristor is provided by a plurality of light-activated silicon carbide thyristor cells on at least a portion of a silicon carbide wafer, the light-activated silicon carbide thyristor cells having corresponding gate regions at a first face of the silicon carbide wafer that are configured to be exposed to light from a light source external to the thyristor cells and first contacts on the first face of the silicon carbide wafer and a second contact on a second face of the silicon carbide wafer opposite the first face. A connecting plate electrically connects the first contacts of ones of the plurality of silicon carbide thyristor cells.

In particular embodiments of the present invention, only selected ones of the plurality of light-activated silicon carbide thyristor cells are electrically connected by the connecting plate. In such embodiments, the selected ones of the plurality of light-activated silicon carbide thyristor cells may be silicon carbide thyristor cells having a blocking voltage greater than a predefined voltage value. Furthermore, the selected ones of the plurality of light-activated silicon carbide thyristor cells may have a first contact which extends a greater distance from the corresponding gate region than a first contact of other ones of the plurality of light-activated silicon carbide thyristor cells which are not selected such that the connecting plate only contacts the first contact of the selected ones of the plurality of light-activated silicon carbide thyristor cells. Alternatively, the selected ones of the plurality of light-activated silicon carbide thyristor cells may have a first contact. Other ones of the plurality of light-activated silicon carbide thyristor cells which are not selected do not have a first contact so that the connecting plate only electrically connects the selected ones of the plurality of light-activated silicon carbide thyristor cells.

Furthermore, the plurality of light-activated thyristor cells may include any of the embodiments described above. For example, the cells may be provided by a silicon carbide substrate having a first conductivity type and a first layer of silicon carbide on the silicon carbide substrate and having a second conductivity type. A plurality of first regions of silicon carbide having the first conductivity type are provided on the second layer of silicon carbide and a plurality of second regions of silicon carbide having the second conductivity are configured to expose a portion of corresponding ones of the plurality of first regions of silicon carbide to light from a light source external to the silicon carbide thyristor cells so as to provide a plurality of light-activated gate regions. A plurality of electrodes are provided on corresponding ones of the second regions of silicon carbide and an electrode is provided on the silicon carbide substrate, opposite the first layer of silicon carbide. Other of the embodiments described above may also be utilized as the thyristor cells.

In additional embodiments of the present invention, a silicon carbide thyristor is fabricated by forming a plurality of light-activated silicon carbide thyristor cells on at least a portion of a silicon carbide wafer. The light-activated silicon carbide thyristor cells have corresponding gate regions configured to be exposed to light from a light source external to the thyristor cells and first contacts on a first side of the plurality of silicon carbide thyristors cells having the corresponding gate regions and a second contact. The plurality of light-activated silicon carbide thyristor cells are electrically tested to select ones of the plurality of light-activated silicon carbide thyristor cells which pass an electrical test. The first contact of the selected ones of the plurality of light-activated silicon carbide thyristor cells are then selectively interconnected.

Such a selective interconnection may be provided, in further embodiments of the present invention, by selectively depositing contact material to provide a first contact for the selected ones of the plurality of light-activated silicon carbide thyristor cells and electrically connecting the deposited contact material. In such embodiments, the deposited contact material may provide first contacts on the selected ones of the plurality of light-activated silicon carbide thyristor cells such that corresponding first surfaces of the first contacts for the selected ones of the plurality of light-activated thyristor cells are substantially coplanar and extend beyond corresponding surfaces of contacts of the ones of the plurality of light-activated silicon carbide thyristor cells which are not selected. The electrical connection may be made by contacting an electrically conductive connecting plate with the first surfaces of the first contacts of the selected ones of the plurality of light-activated silicon carbide thyristor cells. The selective deposition of contact material may, for example, be provided by masking contact regions of ones of the plurality of light-activated silicon carbide thyristor cells which are not selected and depositing contact material so as to provide the first contacts on contact regions of the selected ones of the plurality of light-activated thyristor cells which are not masked.

In still further embodiments of the present invention, the first contacts may be selectively interconnected by depositing contact material to provide first contacts for corresponding ones of the plurality of light-activated silicon carbide thyristor cells. Contact material is removed from ones of the plurality of light-activated silicon carbide thyristor cells such which are not selected and the deposited contact material interconnected for the selected ones of the plurality of light-activated silicon carbide thyristor cells. The removal of the contact material may be provided by removing the contact material such that corresponding first surfaces of the first contacts for the selected ones of the plurality of light-activated thyristor cells are substantially coplanar and extend beyond corresponding surfaces of the first contacts of the ones of the plurality of light-activated silicon carbide thyristor cells which are not selected. An electrically conductive connecting plate which is contacted with the first surfaces of the first contacts of the selected ones of the plurality of light-activated silicon carbide thyristor cells may electrically connected the first contacts of the selected ones of the plurality of light-activated thyristor cells.

Removal of the contact material may be accomplished by, for example, masking the first contacts of selected ones of the plurality of light-activated silicon carbide thyristor cells and etching the first contacts of ones of the first contacts of the ones of the plurality of light-activated silicon carbide thyristor cells which are not masked.

DETAILED DESCRIPTION OF PREFERRED EMBODIMENTS

Figure 1:
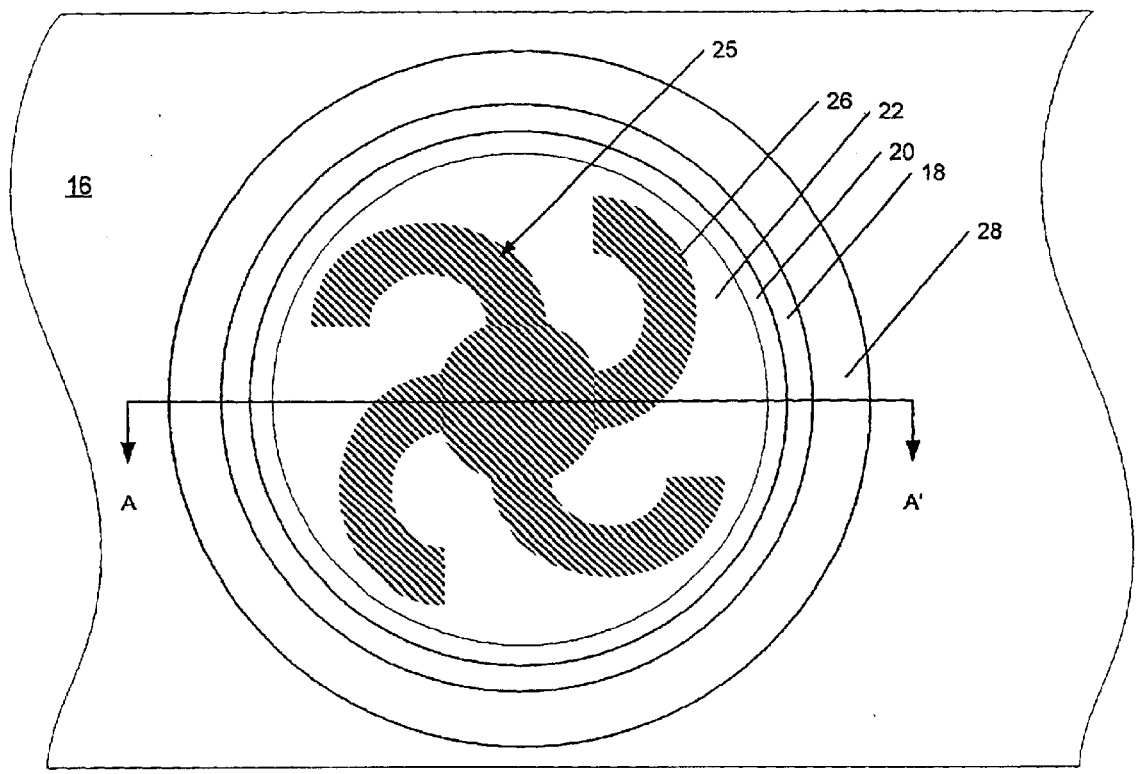
FIG. 1 is a top view of a light-activated thyristor according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Moreover, each embodiment described and illustrated herein includes its complementary conductivity type embodiment as well.

Referring now to the drawings, FIGS. 1 through 8 are schematic partial top views and cross-sectional views of various embodiments of light-activated, two terminal, SiC thyristors according to the present invention. Silicon carbide thyristors according to embodiments of the present invention may be formed of silicon carbide having a polytype of 3C, 2H, 4H, 6H, and 15R. In the illustrated embodiments, the $n^+$ and $n^-$ regions, as well as the $p^+$ and $p^-$, are designated "+" and "−" to symbolize different doping levels respectively of the same material in a manner well understood to those of ordinary skill in this art. The p-type silicon carbide is preferably doped with aluminum or boron and the n-type silicon carbide is preferably doped with nitrogen or phosphorous.

Figure 2:
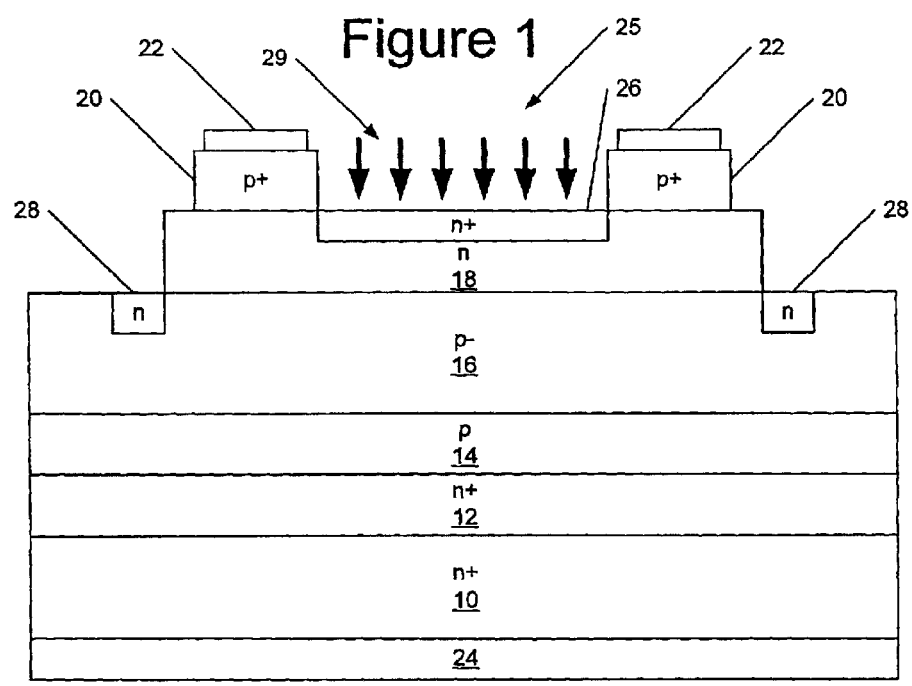
FIG. 2 is a cross-sectional view of a thyristor along lines A–A' of FIG. 1 according to embodiments of the present invention.

FIG. 1 is a top view of a light-activated, two terminal, silicon carbide thyristor according to embodiments of the present invention. FIG. 2 is a cross-sectional view of a light-activated silicon carbide thyristor according to embodiments of the present invention. As seen in FIGS. 1 and 2, a silicon carbide substrate 10 of a first conductivity type, such as $n^+$ conductivity, has a first layer 12 of the same first conductivity type provided thereon. While such first conductivity type layers 12 are illustrated in the Figures, such layers may be optional and may be added to a substrate in order to gain a region with a somewhat higher doping level. Generally speaking, such higher doping levels are easier to produce in epitaxial layers than in substrates taken from bulk crystals. It will be understood, however, that such multiple layers may be replaced by a single layer, which can of course be the substrate, if satisfactorily doped. Accordingly, the layer 12 may be considered optional. In any event, in particular embodiments of the present invention, the substrate 10 may be doped to provide a carrier concentration of from about $10^{18}$ to about $10^{20}$ cm$^{-3}$. Furthermore, the first layer 12 may be doped to provide a carrier concentration of from about $10^{18}$ to about $10^{20}$ cm$^{-3}$. The first layer 12 may, typically, have a thickness of from about 0.5 µm to about 5 µm. The substrate 10 may, typically, have a thickness of from about 8 mils to about 18 mils.

As is further seen in FIG. 2, an optional second layer 14 of second conductivity type silicon carbide, such as p conductivity, may be provided on the first layer 12 so as to provide an asymmetric thyristor. The optional second layer 14 may be doped to provide a carrier concentration of from about $10^{16}$ to about $10^{18}$ cm$^{-3}$. The optional second layer 14 may, typically, have a thickness of from about 0.1 µm to about 5 µm. A third layer 16 of the second conductivity type, such as $p^{31}$ conductivity, is provided on the second layer 14 to provide a drift layer for the light-activated, two terminal, thyristor. The third layer 16 preferably is doped to provide a carrier concentration less than a carrier concentration of the second layer 14. The third layer 16 may be doped, for example, to provide a carrier concentration of up to about $5 \times 10^{16}$ cm$^{-3}$. The third layer 16 may, typically, have a thickness of from about 10 µm to about 300 µm.

A fourth layer 18 of the first conductivity type, such as n conductivity, is provided on the third layer 16 to provide a gate layer. The fourth layer 18 may be doped to provide a carrier concentration of from about $10^{16}$ to about $10^{18}$ cm$^{-3}$. The fourth layer 18 may, typically, have a thickness of from about 0.1 µm to about 5 µm. The fourth layer may be formed as a mesa with a junction termination extension (JTE) region 28 surrounding the periphery of the mesa so as to provide edge termination for the device. Alternatively, edge termination of the device may be provided by a guard ring or by the first, second, third and fourth layers being formed as a mesa having sidewalls which extend to the substrate 10 as described in U.S. Pat. No. 5,539,217 which has been incorporated herein by reference.

A region 20 of second conductivity type silicon carbide, such as $p^+$ conductivity, is provided on the fourth layer 18 and is formed having an opening 25 so as to expose a portion of the fourth layer 18 to provide a gate region which activates the thyristor when light 29 having energy of greater than the bandgap of silicon carbide is incident upon the gate region. The region 20 of second conductivity type silicon carbide may be doped to provide a carrier concentration of from about $10^{18}$ to about $10^{20}$ cm$^{-3}$. The region 20 may, typically, have a thickness of from about 0.5 µm to about 5 µm. As seen in FIG. 2, the gate region may also include an optional region 26 of first conductivity type silicon carbide, such as $n^+$ conductivity, which has a higher carrier concentration than the drift layer 18. A contact 22 may also be provided on the region 20 and a contact 24 may be provided on the substrate 10 to provide anode and cathode contacts for the light activated thyristor. The exposed portion of the gate layer may take various shapes, including the pinwheel configuration illustrated in FIG. 1.

As is illustrated in FIG. 2, the first conductivity type silicon carbide may be n-type silicon carbide and the second conductivity silicon carbide may be p-type silicon carbide. In such embodiments, the contact 22 provides an anode contact and the contact 24 provides a cathode contact. Furthermore, the contact 22 and the contact 24 are on opposite sides of the substrate 10 such that only an anode or a cathode contact is provided on either side of the substrate 10. As described above, embodiments of the present invention may also include the complementary device to that illustrated in FIG. 2.

The operation of the light-activated thyristor may be understood as follows. When a large positive bias is applied on the contact 22 with respect to contact 24, the junction between the drift layer and the gate layer is reverse biased and supports the applied voltage in the p drift layer. At this stage, the thyristor is non-conducting and very little leakage current flows through it. It can be turned-on by shining light, such as ultraviolet (UV) light, with energy in excess of about 3.25 eV (e.g. wavelengths of about $0.382 \mu m$ or greater energy), in the gate region. The UV light creates electron-hole pairs by photo-generation in the reverse biased junction. The photo-induced electrons flow towards the contact 22 and holes flow towards the contact 24. In this process, both the pn junction between the layer 18 and the layer 20 and between the epitaxial 14 and the layer 12 are forward biased and inject more holes and electrons in the p drift layer. These injected holes flow toward the contact 24 and the injected electrons flow toward the contact 22 causing further forward biasing of the pn junctions. If the light intensity is sufficient, a positive feedback process is started, which eventually results in the latching of the thyristor in this "on" state. In the latched state, a high current density can flow from anode to cathode at a relatively small forward voltage drop across the thyristor. Thus, the UV light turns on the thyristor and allows the current to flow. Once the thyristor is turned on, it can be turned-off by reversing the polarity of the voltage applied to the contact 24, by reducing the applied voltage to zero and/or by using other conventional techniques.

Figure 3:
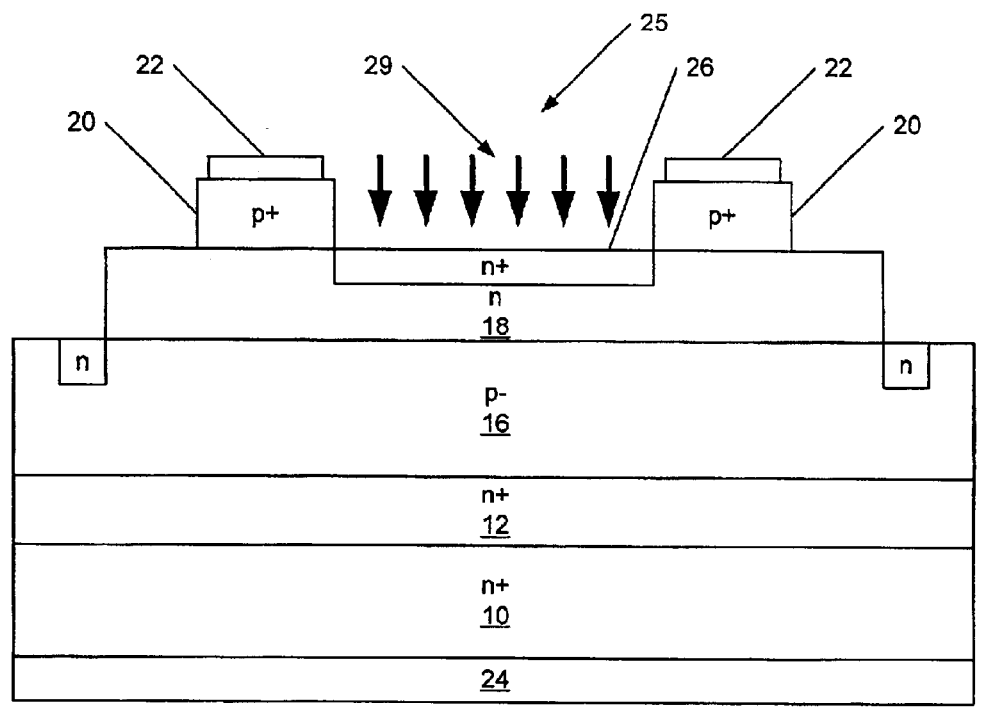
FIG. 3 is a cross-sectional view of a thyristor along lines A–A' of FIG. 1 according to alternative embodiments of the present invention.

FIG. 3 illustrates further embodiments of the present invention where a symmetric light-activated, two terminal, silicon carbide thyristor is provided. As seen in FIG. 3, the second layer 14 is not present in the structure. Otherwise, the structure of FIG. 3 may be the same as that of FIG. 2. Furthermore, as with the structure of FIG. 2, embodiments of the present invention may also include the complementary device to the device illustrated in FIG. 3.

Figure 4:
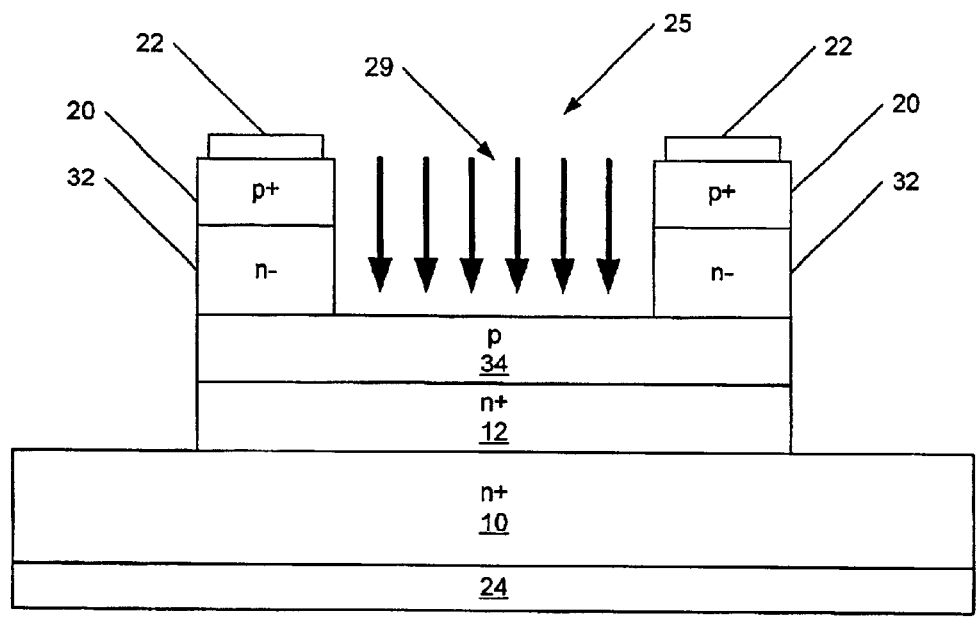
FIG. 4 is a cross-sectional view of a light-activated thyristor according to further alternative embodiments of the present invention.

FIG. 4 illustrates further embodiments of the present invention which may allow for use of a first conductivity type drift layer. A seen in FIG. 4, the substrate 10 has a first conductivity type, such as $n^+$ conductivity, and has an optional first conductivity type silicon carbide layer 12 provided thereon, as described above with reference to FIG. 2. A second layer 34 of second conductivity silicon carbide, such as p-type conductivity, is provided on the first layer to provide a gate layer. A first region 32 of first conductivity silicon carbide, such as $n^-$ conductivity, is provided on the second layer 34 and a second region 20 of second conductivity type silicon carbide, such as $p^+$ conductivity, is provided on the first region 32. The first region 32 and the second region 20 are formed so as to expose a gate region of the second layer 34. A contact 22 is provided on the second region 20 and a contact 24 is provided on the substrate 10 so as to provide anode and cathode contacts. An optional region (not shown) of higher carrier concentration second conductivity type silicon carbide may also be provided in the gate region of the second layer 34. As with the structures of FIGS. 2 and 3, embodiments of the present invention may also include the complementary device to the device illustrated in FIG. 4. Physical dimensions and doping levels may be as described above for corresponding portions of the structures of FIGS. 2 and 3.

Figure 5:
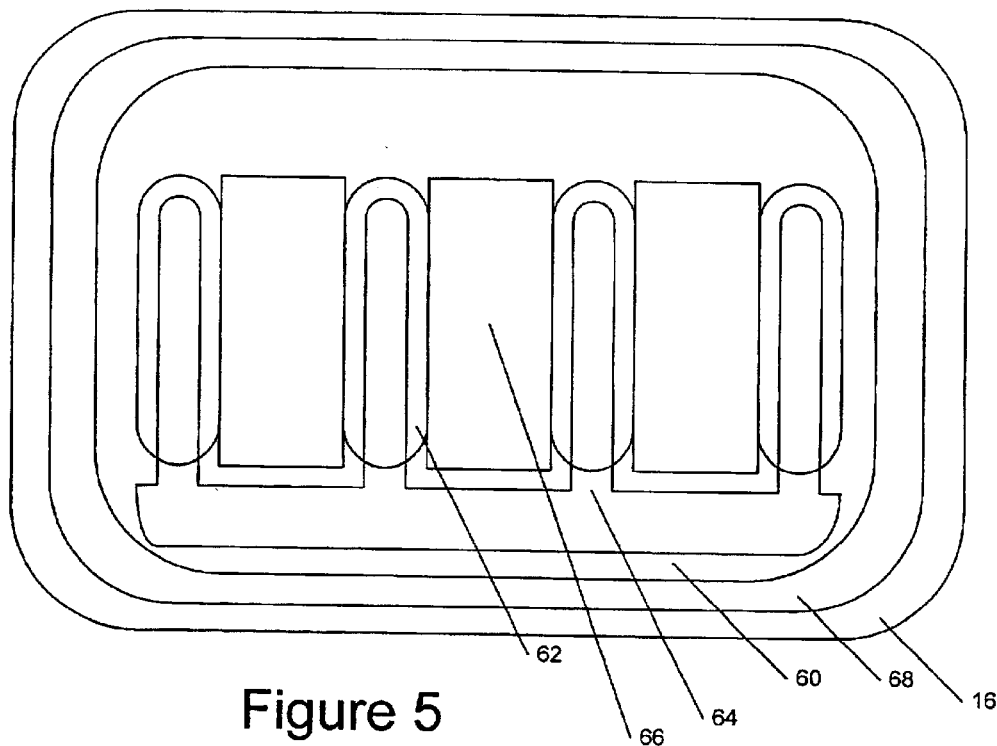
FIG. 5 is a top view of a light-activated thyristor according to further embodiments of the present invention.
Figure 6:
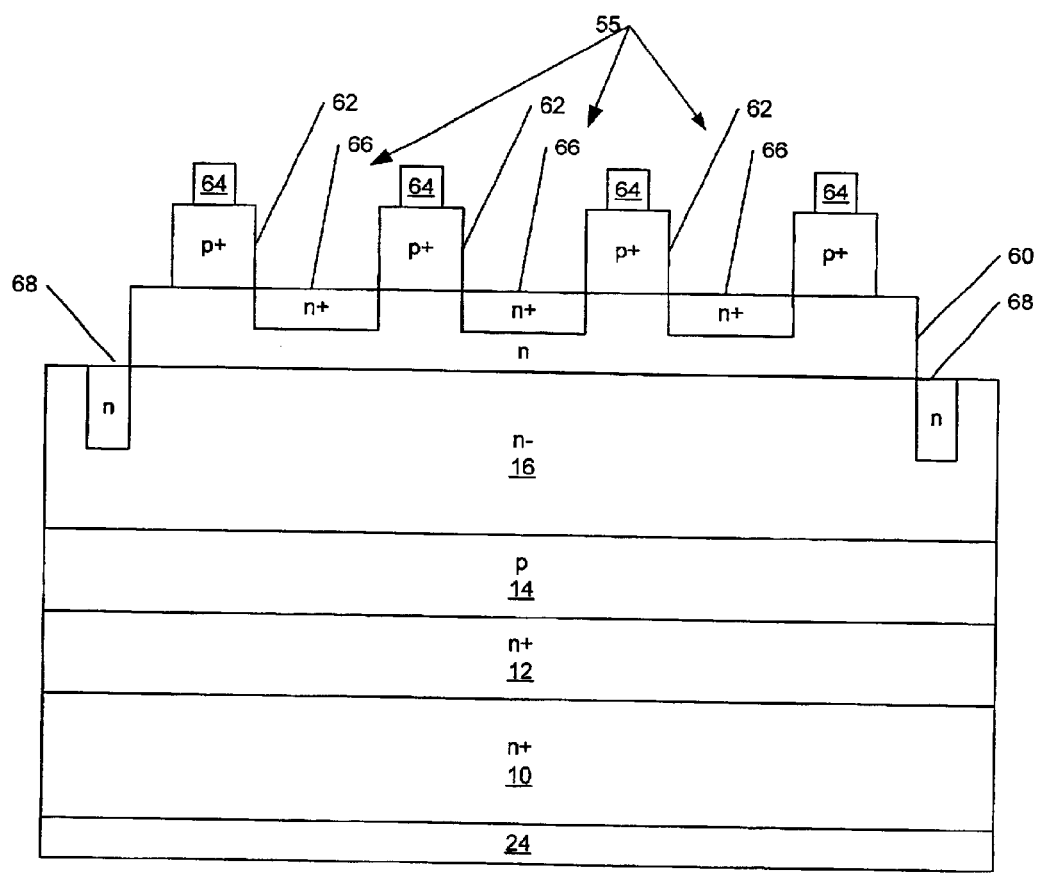
FIG. 6 is a cross-sectional view of a thyristor along lines B–B' of FIG. 5 according to embodiments of the present invention.

FIGS. 5 and 6 illustrate further embodiments of the present invention where an interdigited structure is provided. As seen in FIGS. 5 and 6, a plurality of openings 55 provide a plurality of fingers of the second conductivity type layer 62 on which a plurality of contact fingers 64 are formed. Similarly, a plurality of regions of first conductivity silicon type carbide 66 may be provided in the fourth layer 60. The fourth layer 60 may also be formed as a mesa having edge termination regions 68 about the periphery of the mesa. As is illustrated in FIG. 5 by the dotted lines, the contact fingers 64 may optionally be connected together by the contact material of the contact fingers 64. Alternatively, the fingers may be formed as stripes and contacted together as described below through the use of a contacting plate.

The interdigited embodiments illustrated in FIGS. 5 and 6 correspond to the device of FIG. 2. However, as will be appreciated in light of the present disclosure, each of the embodiments illustrated in FIGS. 3 and 4, as well as the complementary devices, may also be embodied utilizing an interdigited structure.

In particular embodiments of the present invention, the light-activated silicon carbide thyristors have device size or cross-sectional area based on a desired yield for the devices, where the cross-sectional area is defined as the area circumscribed by the edge termination of the device. Thus, for example, the cross-sectional area may be determined based on the area circumscribed by the JTE regions 28 for embodiments utilizing JTE, the area of the mesa for mesa edge terminated embodiments or the area circumscribed by a guard ring for guard ring edge terminated devices. Such a device size may be determined, for example, by determining how many individually isolated devices of a given size may be provided on the portion of the silicon carbide wafer and what percentage yield would be associated with such devices. It may then be determined if a sufficient number of devices on the portion of the silicon carbide wafer would be expected to be of sufficient quality so as to provide the desired number of devices which may be interconnected in parallel to provide the desired operating characteristic (e.g. current handling capability). For example, light-activated silicon carbide thyristors may have a cross-sectional area of up to about 20 $cm^2$ or greater.

Figure 7:
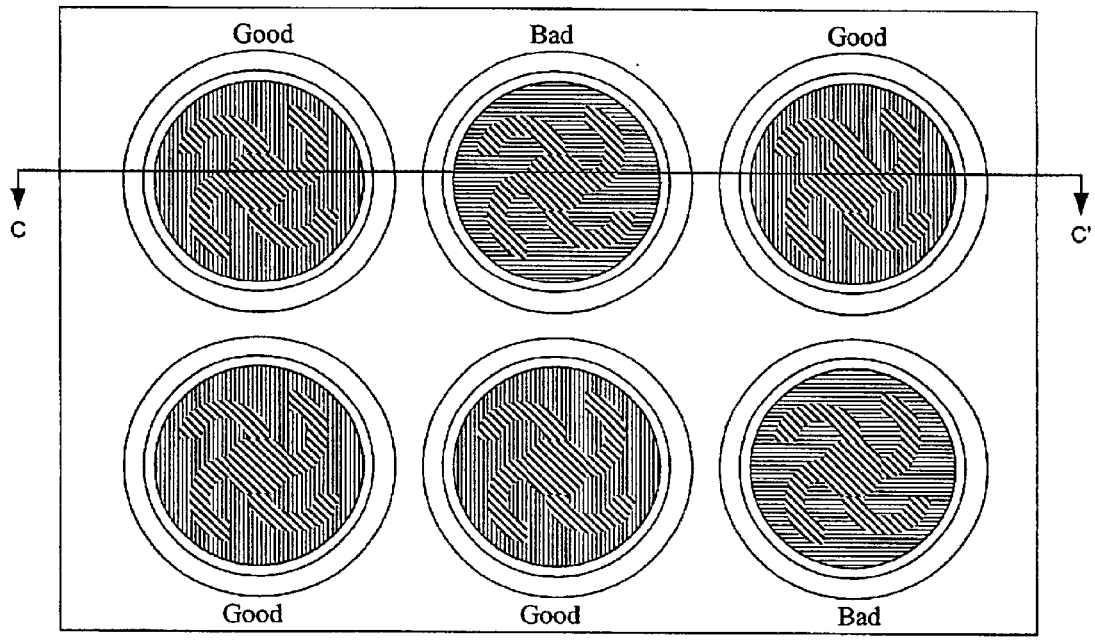
FIG. 7 is a top view of a portion of a wafer having a plurality of light-activated silicon carbide thyristors for providing a multiple thyristor device according to embodiments of the present invention.
Figure 8:
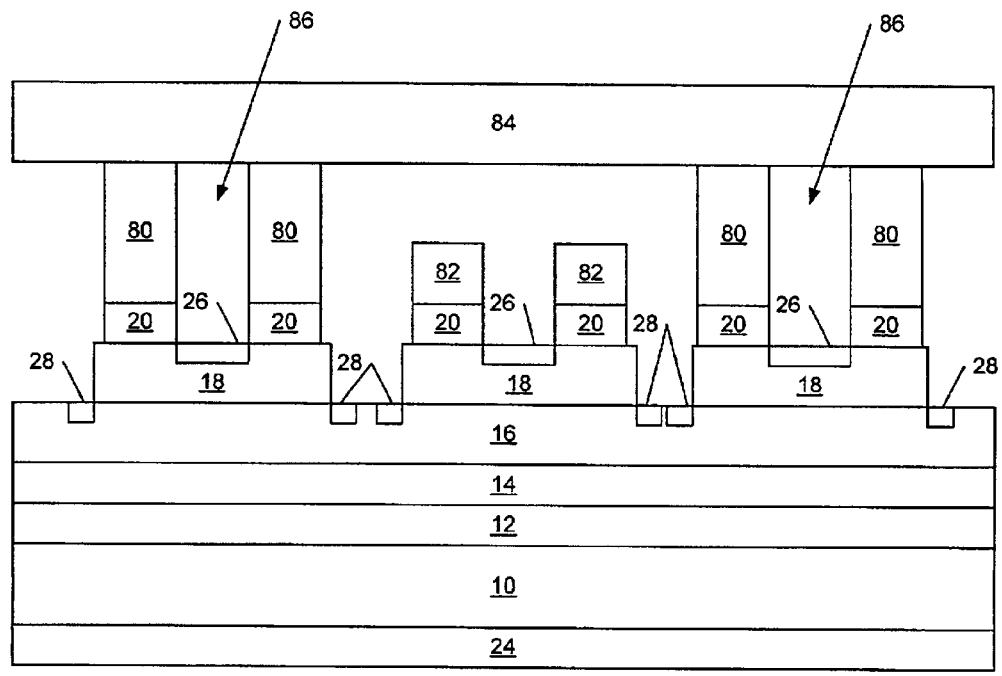
FIG. 8 is a cross-sectional view of a multiple thyristor device along lines C–C' of FIG. 7 according to embodiments of the present invention which include a conductive plate for interconnecting selective ones of the plurality of light-activated thyristors.

As mentioned above, light activated silicon carbide thyristors according to embodiments of the present invention may be provided on wafers having a cross-sectional area greater than the area of the silicon carbide thyristors, such that a plurality of light-activated silicon carbide thyristors may be provided on a single wafer or portion of a wafer. Such a plurality of light-activated silicon carbide thyristors according to embodiments of the present invention are illustrated in FIGS. 7 and 8. As is seen in FIGS. 7 and 8, because the light-activated thyristors have only a single terminal on any give side of the devices, the light-activated thyristors may be readily connected in parallel without the need for a complex interconnect system. Thus, while embodiments of the present invention are described herein with reference to light-activated silicon carbide thyristors, the techniques described herein for selectively interconnecting silicon carbide devices may be utilized with any silicon carbide device having a single terminal on any given side of the device. Accordingly, embodiments of the present invention may be applicable to silicon carbide diodes or the like.

FIGS. 7 and 8 illustrate embodiments of the present invention where a plurality of light-activated silicon carbide thyristors are provided on a wafer, a portion of a wafer or multiple wafers. Each of the light-activated silicon carbide thyristors may be edge terminated, for example, by mesa edge termination, junction termination extension or the like. For example, light-activated silicon carbide thyristors may have edge termination as described in commonly assigned U.S. patent application Ser. No. 09/723,710, entitled "EPITAXIAL EDGE TERMINATION FOR SILICON CARBIDE SCHOTTKY DEVICES AND METHODS OF FABRICATING SILICON CARBIDE DEVICES INCORPORATING SAME" which was filed Nov. 28, 2000, the disclosure of which is incorporated herein by reference as if set forth fully herein. Edge termination of the devices may provide isolation of the devices from each other such that devices which may have incorporated defects which may adversely affect their electrical properties may be isolated from devices which do not incorporate such defects.

As seen in FIGS. 7 and 8, a large number of smaller light-activated thyristor cells can be connected in parallel. A plurality of thyristor cells may be provided and electrically tested such that "good" cells may be defined as the cells that pass the electrical test, e.g., block the specified voltage in the forward direction (anode to cathode). Bad cells will fail the electrical test, e.g., not block the specified voltage due to the defects in the material, processing problems and/or other defects. The good cells may be selected by means of an electrical test or tests which are known to those of skill in the art.

The good cells may be selectively connected by selectively varying the thickness of the contact material for good cells such that the contacts extend past the contacts for bad cells. Such an adjustment of the contact thickness may be made either prior to formation of the contacts by, for example, selective deposition of contact material, or after formation of the contacts by, for example, selective removal of contact material.

In particular, photolithography may be utilized to connect only the good cells by exposing only the good cells such that a mask over contact regions of the good cells is removed and the mask remains over the contact regions of the bad cells. A thick metal (for example, from about 6 to about 25 μm) may then be deposited on the exposed contact regions of the good cells, such as on the anode terminals of the good cells. Alternatively, all the cells may receive thick metal on, for example, the anode terminal, and be tested to select the good and bad cells. The thick metal may then be selectively removed from the bad cells by various techniques known to those of skill in the art, such as masking the contacts of the good cells and selectively etching the contacts of the bad cells. Similarly, a lift-off technique may also be utilized where a first material is deposited on the bad cells and then a blanket deposit of contact material is provided. The contact material may then be lifted off of the bad cells while remaining on the good cells. Furthermore, an automatic technique could be utilized where failure of the electrical test causes a contact of a bad cell to be electrically isolated from the thyristor cell or to change in thickness with relation to good cells, for example, by melting a contact of a thyristor cell. In any case, a pressure contact using a flat plate will only contact the good cells with the thick metal. The UV light can be routed by a fiber inside the assembly.

Such an interconnection of selected cells of the plurality of thyristors is illustrated in FIG. 8 which is a cross-section along lines C–C' of FIG. 7. As seen in FIG. 8, the thick metal 80 is provided on cells which have passed the electrical test while a thinner metal 82, or even no metal at all, may be provided on cells which fail the electrical test. The thick metal 80 may provide a substantially coplanar first surface of the contacts which extends past the corresponding surface of the thinner metal 82. Thus, the cells which have passed the electrical test may then be interconnected by a connecting plate 84.

As is known to those of skill in the art, the connecting plate 84 may be attached by pressure, such as that applied by a spring clip or other such device or may even be attached through, for example, a permanent solder connection. The connecting plate 84 may be any conductive material of suitable strength to bridge the gaps between the metal contacts 80 of the good cells and may be a single conductive material, such as aluminum, copper or the like a composite of materials, for example, a steel plate with a conductive coating.

A UV light source external to the thyristor cells provides UV light into the openings 86, for example, through the use of fiber optics, a light pipe, reflective surfaces, free space, and/or other such light distribution mechanisms known to those of skill in the art. The connecting plate 84 may also be reflective to facilitate distribution of UV light in the openings 86.

The present invention has been described with reference to particular layers of silicon carbide. As will be appreciated by those of skill in the art in light of the present disclosure, such layers may be provided by epitaxial growth, ion implantation or other such techniques for producing layers of silicon carbide. Accordingly, embodiments of the present invention are intended to include structures having layers of silicon carbide as described herein however they are fabricated.

While the present invention has been described with reference to the particular structures illustrated in FIGS. 1 through 8, as will be appreciated by those of skill in the art in light of the present disclosure, various modifications may be made to such structures while still benefiting from the teachings of the present invention. For example, an oxide or passivating layer may be provided on the overall structures of FIGS. 1 through 8 which may allow UV light to reach the gate regions. Similarly, other patterns for the gate regions, such a circles, may be also be utilized. Accordingly, the present invention should not be construed as limited to the particular structures described above.

Similarly, while the present invention has been described with reference to light activated silicon carbide devices, as will be appreciated by those of skill in the art in light of the present disclosure, embodiments of the present invention may be utilized with any two terminal device having a single contact on one side of the device. Thus, other forms of silicon carbide device cells may be selectively interconnected utilizing a connecting plate to provide a large area silicon carbide device made up of a plurality of silicon carbide device cells. Accordingly, the present invention should not be construed as limited to light activated thyristors.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A silicon carbide device, comprising:
   a plurality of silicon carbide device cells on at least a portion of a silicon carbide wafer, the silicon carbide cells having first contacts on a first face of the silicon carbide wafer and second contacts on a second face of the silicon carbide wafer; and
   a connecting plate which electrically connects the first contacts of ones of the plurality of silicon carbide cells;
   wherein the plurality of silicon carbide device cells comprise a plurality of light-activated silicon carbide thyristor cells on at least a portion of the silicon carbide wafer, the light-activated silicon carbide thyristor cells having corresponding gate regions at the first face of the silicon carbide wafer that are configured to be exposed to light from a light source external to the thyristor cells and first contacts on the first face of the silicon carbide wafer and a second contact on a second face of the silicon carbide wafer opposite the first face;
   wherein the connecting plate comprises a connecting plate which electrically connects the first contacts of ones of the plurality of silicon carbide thyristor cells;
   wherein only selected ones of the plurality of light-activated silicon carbide thyristor cells are electrically connected by the connecting plate such that at least one of the plurality of light-activated silicon carbide thyristor cells is not electrically connected by the connecting plate; and
   wherein the selected ones of the plurality of light-activated silicon carbide thyristor cells have a first contact and other ones of the plurality of light-activated silicon carbide thyristor cells which are not selected do not have a first contact so that the connecting plate only electrically connects the selected ones of the plurality of light-activated silicon carbide thyristor cells.

2. The silicon carbide device of claim 1, wherein the selected ones of the plurality of light-activated silicon carbide thyristor cells comprise silicon carbide thyristor cells having a blocking voltage greater than a predefined voltage value.

3. The silicon carbide device of claim 1, wherein the plurality of light-activated thyristor cells comprise:
   a silicon carbide substrate having a first conductivity type;
   a first layer of silicon carbide on the silicon carbide substrate and having a second conductivity type;
   a plurality of first regions of silicon carbide having the first conductivity type and on the first layer of silicon carbide opposite the substrate;
   a plurality of second regions of silicon carbide having the second conductivity type on the first regions of silicon carbide opposite the first layer of silicon carbide, the plurality of second regions being configured to expose a portion of corresponding ones of the plurality of first regions of silicon carbide to light from a light source external to the silicon carbide thyristor cells so as to provide a plurality of light-activated gate regions;
   a plurality of first electrodes on corresponding ones of the second regions of silicon carbide; and
   at least one second electrode on the silicon carbide substrate.

4. The silicon carbide device of claim 3, wherein the plurality of light-activated thyristor cells further comprises a second layer of silicon carbide disposed between the silicon carbide substrate and the first layer of silicon carbide and having the first conductivity type.

5. The silicon carbide device of claim 3, wherein the of light-activated thyristor cells further comprises a second layer of silicon carbide disposed between the silicon carbide substrate and the first layer of silicon carbide, the second layer of silicon carbide being the second conductivity type and having a carrier concentration greater than a carrier concentration of the first layer of silicon carbide.

6. The silicon carbide device of claim 3 wherein the first regions of silicon carbide form a corresponding plurality of mesas.

7. The silicon carbide device of claim 6, further comprising a plurality of third regions of first conductivity type silicon carbide in the first layer of silicon carbide at the periphery of corresponding ones of the mesas formed by the first region of silicon carbide so as to provide edge termination.

8. The silicon carbide device of claim 3, wherein the plurality of light-activated thyristor cells further comprises a third region of silicon carbide having the first conductivity type in corresponding ones of the exposed portion of the first regions of silicon carbide and having a carrier concentration greater than a carrier concentration of the first regions of silicon carbide.

9. The silicon carbide device of claim 3, wherein the first conductivity type comprises n-type conductivity silicon carbide and the second conductivity type comprises p-type conductivity silicon carbide.

10. The silicon carbide device of claim 3, wherein the first conductivity type comprises p-type conductivity silicon carbide and the second conductivity type comprises n-type conductivity silicon carbide.

11. The silicon carbide device of claim 3, wherein the second regions of silicon carbide are configured to expose pinwheel-shaped portions of the first regions of silicon carbide to light from a light source external to the silicon carbide thyristor cells so as to provide light-activated gate regions having a pinwheel configuration.

12. The silicon carbide device of claim 3, wherein the second regions of silicon carbide comprise a plurality of fingers configured to expose a corresponding plurality of finger portions of corresponding ones of the first regions of silicon carbide to light from a light source external to the silicon carbide thyristor cells so as to provide light-activated gate regions interdigited with the corresponding second regions of silicon carbide.

13. The silicon carbide device of claim 1, wherein the plurality of light-activated thyristor cells comprises;
   a silicon carbide substrate having a first conductivity type;
   a first layer of silicon carbide on the silicon carbide substrate and having a second conductivity type;
   a plurality of first regions of silicon carbide having the first conductivity type and on the first layer of silicon carbide opposite the substrate;
   a plurality of second regions of silicon carbide on corresponding ones of the plurality of first regions of silicon carbide opposite the first layer of silicon carbide and having the second conductivity type;
   wherein corresponding ones of the first and second regions of silicon carbide are configured to expose a portion of the first layer of silicon carbide to light from a light source external to the silicon carbide thyristor so as to provide a light-activated gate region;
   a plurality of first electrodes on corresponding ones of the second regions of silicon carbide; and
   at least one second electrode on the silicon carbide substrate, opposite the first layer of silicon carbide.

14. The silicon carbide device of claim 13, further comprising a second layer of silicon carbide disposed between the silicon carbide substrate and the first layer of silicon carbide and having the first conductivity type.

15. The silicon carbide device of claim 13, further comprising a plurality of third regions of silicon carbide having the second conductivity type in corresponding ones of the exposed portions of the first layer of silicon carbide and having a carrier concentration greater than a carrier concentration of the silicon carbide substrate.

16. The silicon carbide device of claim 13, wherein the first conductivity type comprises n-type conductivity silicon carbide and the second conductivity type comprises p-type conductivity silicon carbide.

17. The silicon carbide device of claim 13, wherein the first conductivity type comprises p-type conductivity silicon carbide and the second conductivity type comprises n-type conductivity silicon carbide.

18. The silicon carbide device of claim 13, wherein corresponding ones of the first and second regions of silicon carbide are configured to expose a pinwheel-shaped portion of the first layer of silicon carbide to light from a light source external to the silicon carbide thyristor so as to provide a light-activated gate region having a pinwheel configuration.

19. The silicon carbide device of claim 13, wherein corresponding ones of the first and second regions of silicon carbide comprise a plurality of fingers configured to expose a corresponding plurality of finger portions of the first layer of silicon carbide to light from a light source external to the silicon carbide thyristor so as to provide a light-activated gate region interdigited with the first and second regions of silicon carbide.

* * * * *